United States Patent
Khan et al.

(10) Patent No.: US 11,262,913 B2
(45) Date of Patent: Mar. 1, 2022

(54) TECHNOLOGIES FOR EFFICIENT STOCHASTIC ASSOCIATIVE SEARCH OPERATIONS WITH ERROR-CORRECTING CODE

(71) Applicant: Intel Corporation, Santa Clara, CA (US)

(72) Inventors: Jawad B. Khan, Portland, OR (US); Richard Coulson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 292 days.

(21) Appl. No.: 16/367,320

(22) Filed: Mar. 28, 2019

(65) Prior Publication Data

US 2019/0220202 A1    Jul. 18, 2019

(51) Int. Cl.
| | |
|---|---|
| *G06F 3/06* | (2006.01) |
| *G06F 11/10* | (2006.01) |
| *G11C 29/52* | (2006.01) |
| *G11C 29/04* | (2006.01) |

(52) U.S. Cl.
CPC .......... *G06F 3/0611* (2013.01); *G06F 3/0659* (2013.01); *G06F 3/0679* (2013.01); *G06F 11/1068* (2013.01); *G11C 29/52* (2013.01); *G11C 2029/0411* (2013.01)

(58) Field of Classification Search
CPC .... G06F 3/0611; G06F 3/0679; G06F 3/0657; G06F 11/1068; G06F 11/1012; G11C 21/52
See application file for complete search history.

(56) References Cited

U.S. PATENT DOCUMENTS

| | | | | |
|---|---|---|---|---|
| 4,755,974 A | * | 7/1988 | Yamada ................. | G11C 15/04 365/49.1 |
| 5,053,991 A | * | 10/1991 | Burrows ........... | G06F 16/90339 365/49.17 |
| 5,130,945 A | * | 7/1992 | Hamamoto ............ | G11C 15/04 365/45 |

(Continued)

OTHER PUBLICATIONS

W. Wu, D. Somasekhar and S. Lu, "Direct Compare of Information Coded With Error-Correcting Codes," in IEEE Transactions on Very Large Scale Integration (VLSI) Systems, vol. 20, No. 11, pp. 2147-2151, Nov. 2012, doi: 10.1109/TVLSI.2011.2169094. (Year: 2012).*

*Primary Examiner* — Ramon A. Mercado
(74) *Attorney, Agent, or Firm* — Jordan IP Law, LLC

(57) ABSTRACT

Technologies for stochastic associative search operations in memory (e.g., a three-dimensional cross-point memory) using error correction codes include a compute device. The compute device has a memory including a matrix that stores individually addressable bit data and is formed by rows and columns. The compute device receives a request to retrieve a subset of the bit data stored in the matrix. The compute device identifies, based on a search performed on the columns in the matrix, one or more candidate data sets. Each candidate data set corresponds to one of the rows in the matrix. The compute device performs an error correction operation on the identified one or more candidate data sets to determine whether the identified one or more candidate data sets is an exact match with the subset of the bit data.

20 Claims, 7 Drawing Sheets

(56) References Cited

U.S. PATENT DOCUMENTS

| | | | | |
|---|---|---|---|---|
| 7,002,965 | B1* | 2/2006 | Cheriton | H04L 45/00 370/395.32 |
| 7,187,571 | B1* | 3/2007 | Lien | G11C 7/02 365/189.07 |
| 7,193,876 | B1* | 3/2007 | Park | G11C 15/00 365/189.07 |
| 10,936,408 | B2* | 3/2021 | Wu | H03M 13/152 |
| 2003/0229636 | A1* | 12/2003 | Mattausch | G06K 9/00986 |
| 2004/0120174 | A1* | 6/2004 | Regev | G11C 15/00 365/49.1 |
| 2005/0010719 | A1* | 1/2005 | Slavin | G11C 15/00 711/108 |
| 2005/0114393 | A1* | 5/2005 | Wilson | H04L 45/7457 |
| 2005/0154726 | A1* | 7/2005 | Mattausch | G06K 9/00986 |
| 2006/0080498 | A1* | 4/2006 | Shoham | G11C 15/00 711/108 |
| 2007/0088910 | A1* | 4/2007 | Parthasarathy | G11C 15/04 711/108 |
| 2014/0032832 | A1* | 1/2014 | Asamoto | H04L 45/7457 711/108 |
| 2015/0029784 | A1* | 1/2015 | Yabuuchi | G11C 11/419 365/154 |
| 2015/0095738 | A1* | 4/2015 | Zampaglione | G06F 11/1064 714/758 |
| 2015/0095740 | A1* | 4/2015 | Zampaglione | G06F 11/1068 714/764 |
| 2016/0357630 | A1* | 12/2016 | Kang | G11C 29/52 |
| 2019/0220202 | A1* | 7/2019 | Khan | G06F 11/1068 |
| 2020/0219580 | A1* | 7/2020 | Khan | G11C 29/44 |

* cited by examiner

TECHNOLOGIES FOR EFFICIENT STOCHASTIC ASSOCIATIVE SEARCH OPERATIONS WITH ERROR-CORRECTING CODE

BACKGROUND

Memory devices often provide access to memory using matrix operations. Memory matrix operations have multiple applications in various settings, such as in the fields of artificial intelligence and machine learning. In such operations, a device may manipulate data in rows and columns. However, currently existing methods for row and column access are computationally expensive and may increase latency. Further, it is oftentimes desirable to locate a given subset of data stored in the matrix. Typically, searching for the subset of data includes iterating through each row and evaluating the data to identify whether the row provides an exact match with the subset. However, given that the memory may store a large amount of data, and given that the amount of data in the subset may be large, iterating through each row to find a matching subset of data can be inefficient.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
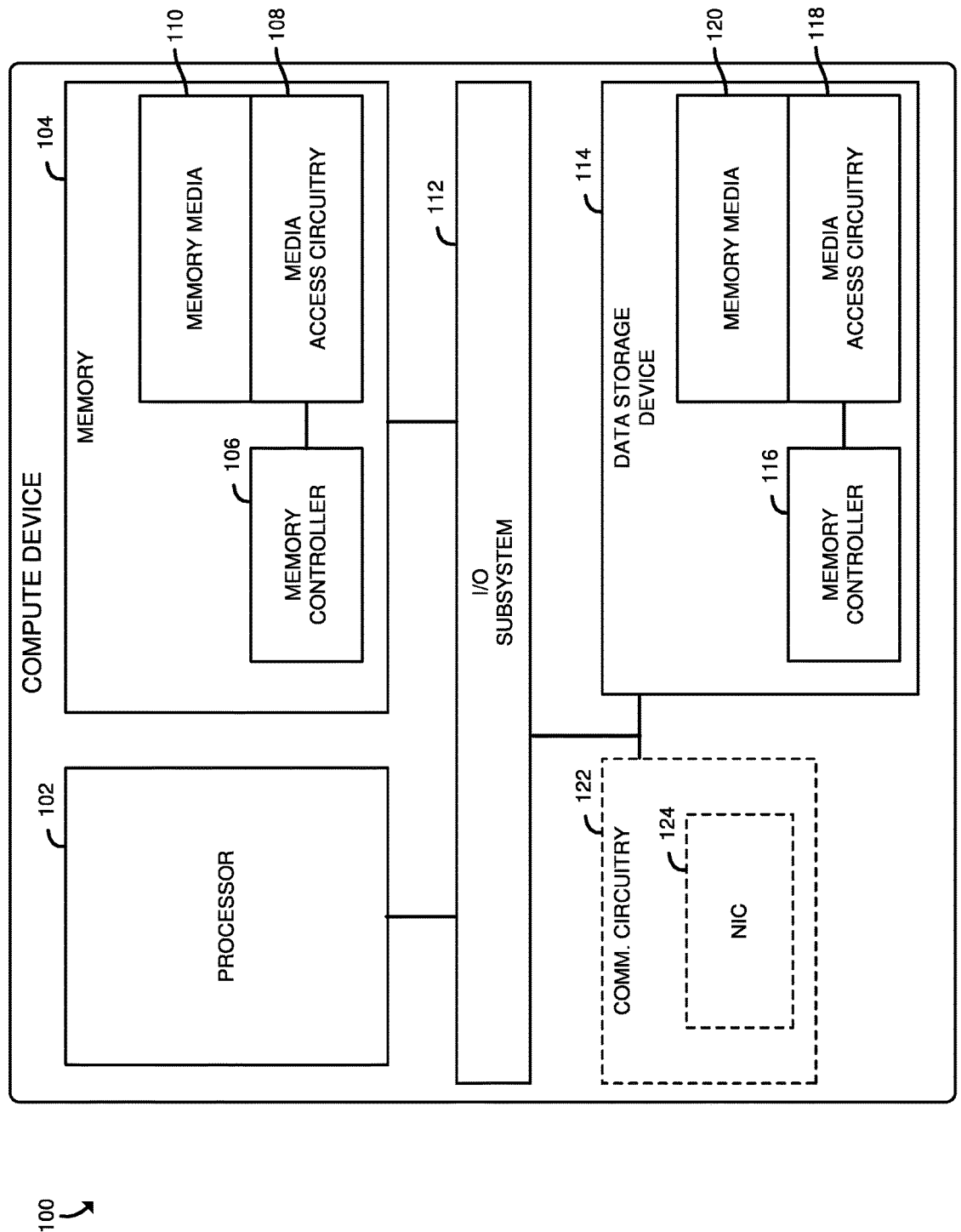
FIG. 1 is a simplified block diagram of at least one embodiment of an example compute device to perform stochastic associative search operations on memory.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, a compute device 100 for performing stochastic associative search operations on bit-addressable memory includes a processor 102, memory 104, an input/output (I/O) subsystem 110, a data storage device 114, and communication circuitry 122. Of course, in other embodiments, the compute device 100 may include other or additional components, such as those commonly found in a computer (e.g., a display, peripheral devices, etc.). Additionally, in some embodiments, one or more of the illustrative components may be incorporated in, or otherwise form a portion of, another component. As further described herein, the compute device 100, and in particular, the memory of the compute device 100 allows bits of data to be individually addressable. More particularly, the memory may be implemented as a three-dimensional cross-point architecture embodied as a set of tiles that are each addressable by an x parameter and a y parameter (e.g., a column and a row). Each tile represents a single bit of data (e.g., a 0 or a 1). Further, a set of tiles form a partition, and multiple partitions may be logically stacked to form the three-dimensional cross-point architecture. Doing so allows data to be efficiently accessed in column-major form, which, as further described herein, enables stochastic associative search operations to be performed based on column access.

The processor 102 may be embodied as any device or circuitry (e.g., a multi-core processor(s), a microcontroller, or other processor or processing/controlling circuit) capable of executing a workload (e.g., a set of operations, such as an application that may produce requests to read from and/or write to sections of memory, such as selected columns and/or rows of data in a matrix) and/or performing other operations described herein. In some embodiments, the processor 102 may be embodied as, include, or be coupled to an FPGA, an application specific integrated circuit (ASIC), reconfigurable hardware or hardware circuitry, or other specialized hardware to facilitate performance of the functions described herein.

The memory 104, which may include a non-volatile memory (e.g., a far memory in a two-level memory scheme), includes a memory media 110 and media access circuitry 108 (e.g., a device or circuitry, such as integrated circuitry constructed from complementary metal-oxide-semiconductors (CMOS) or other materials) underneath the memory media 110. The media access circuitry 108 is also connected to a memory controller 106, which may be embodied as any device or circuitry (e.g., a processor, a co-processor, dedicated circuitry, etc.) configured to selectively read from and/or write to the memory media 110 (e.g., in response to requests from the processor 102, which may be executing an application seeking to read from or write to the memory media 110). The memory media 110, in the illustrative embodiment, includes a set of tiles (e.g., each an addressable section of the memory media 110 capable of retaining data) arranged in a cross point architecture (e.g., an architecture in which memory cells sit at the intersection of word lines and bit lines and are individually addressable and in which bit storage is based on a change in bulk resistance), in which each tile is addressable by an x parameter and a y parameter (e.g., a column and a row). A set of tiles form a partition and multiple partitions may be stacked to form a three-dimensional cross point architecture (e.g., Intel 3D XPoint™ memory). Unlike typical memory devices, in which only fixed-size multiple-bit data structures (e.g., byte, words, etc.) are addressable, the media access circuitry 108 is configured to read individual bits, or other units of data, from the memory media 110 at the request of the memory controller 106, which may produce the request in response to receiving a corresponding request from the processor 102.

In the illustrative embodiment, the media access circuitry 108 defines logical rows and logical columns in which each bit maps to a tile in a given partition and can be addressed individually, allowing data structures of variable lengths to be accessed. For instance, the media access circuitry 108 may receive a request (e.g., from the memory controller 106) to read a data structure (e.g., a sequence of bits) of an arbitrary size. In response, the media access circuitry 108 may individually address (e.g., read the value of) each bit from the memory media 110 and concatenate the read values to form a data structure of the requested size. Further, the media access circuitry 108 may write a data structure of an arbitrary size (e.g., a data structure of any number of bits specified by the memory controller 106) to the memory media by individually writing data to each corresponding tile (e.g., bit) in the memory media 110. Individually addressing bits in the memory media 110 provides for greater flexibility for data access compared to conventional memory devices that use fixed-size multiple-bit data structures. Further still, doing so allows the memory media 110 to evaluate data on a column-major basis, such as in performing stochastic search operations according to the embodiments disclosed herein.

The main memory 104 may also include various types of volatile or non-volatile memory or data storage capable of performing the functions described herein. More particularly, the non-volatile memory may be embodied as any type of data storage capable of storing data in a persistent manner, even if power is interrupted to non-volatile memory. The non-volatile memory can include one or more memory devices configured in a cross-point architecture that enables bit-level addressability (e.g., the ability to read from and/or write to individual bits of data rather than bytes or other units of data) and may be embodied as three-dimensional (3D) crosspoint memory. In some embodiments, the non-volatile memory may additionally include other types of memory, including any combination of memory devices that use chalcogenide phase change material (e.g., chalcogenide glass), ferroelectric transistor random-access memory (Fe-TRAM), nanowrite-based non-volatile memory, phase change memory (PCM), memory that incorporates memristor technology, magnetoresistive random-access memory (MRAM) or Spin Transfer Torque (STT)-MRAM. The volatile memory may be embodied as any type of data storage capable of storing data while power is supplied volatile memory. For example, the volatile memory may be embodied as one or more volatile memory devices, and is periodically referred to hereinafter as volatile memory with the understanding that the volatile memory may be embodied as other types of non-persistent data storage in other embodiments. The volatile memory may have an architecture that enables bit-level addressability, similar to the architecture described above.

The processor 102 and the memory 104 are communicatively coupled to other components of the compute device 100 via the I/O subsystem 112, which may be embodied as circuitry and/or components to facilitate input/output operations with the processor 102 and/or the main memory 104 and other components of the compute device 100. For example, the I/O subsystem 112 may be embodied as, or otherwise include, memory controller hubs, input/output control hubs, integrated sensor hubs, firmware devices, communication links (e.g., point-to-point links, bus links, wires, cables, light guides, printed circuit board traces, etc.), and/or other components and subsystems to facilitate the input/output operations. In some embodiments, the I/O subsystem 112 may form a portion of a system-on-a-chip (SoC) and be incorporated, along with one or more of the processor 102, the main memory 104, and other components of the compute device 100, in a single chip.

The data storage device 114, may be embodied as any type of device configured for short-term or long-term storage of data such as, for example, memory devices and circuits, memory cards, hard disk drives, solid-state drives, or other data storage device. In the illustrative embodiment, the data storage device 114 includes a memory controller 116, similar to the memory controller 106, media access circuitry 118, similar to the media access circuitry 108, and memory media 120, similar to the memory media 110. As such, in the illustrative embodiment, the data storage device 114 is capable of efficiently accessing (e.g., reading and/or writing to) selected rows and columns of data (e.g., in a multi-dimensional matrix) in the memory media 120. The data storage device 114 may include a system partition that stores data and firmware code for the data storage device 114 and one or more operating system partitions that store data files and executables for operating systems.

The communication circuitry 122 may be embodied as any communication circuit, device, or collection thereof, capable of enabling communications over a network between the compute device 100 and another device. The communication circuitry 122 may be configured to use any one or more communication technology (e.g., wired or wireless communications) and associated protocols (e.g., Ethernet, Bluetooth®, Wi-Fi®, WiMAX, etc.) to effect such communication.

The illustrative communication circuitry 122 includes a network interface controller (NIC) 122, which may also be referred to as a host fabric interface (HFI). The NIC 124 may be embodied as one or more add-in-boards, daughter cards, network interface cards, controller chips, chipsets, or other devices that may be used by the compute device 100 to connect with another compute device. In some embodiments, the NIC 124 may be embodied as part of a system-on-a-chip (SoC) that includes one or more processors, or included on a multichip package that also contains one or more processors. In some embodiments, the NIC 124 may include a local processor (not shown) and/or a local memory (not shown) that are both local to the NIC 124. In such embodiments, the local processor of the NIC 124 may be capable of performing one or more of the functions of the processor 102. Additionally or alternatively, in such embodiments, the local memory of the NIC 124 may be integrated into one or more components of the compute device 100 at the board level, socket level, chip level, and/or other levels.

Figure 2:
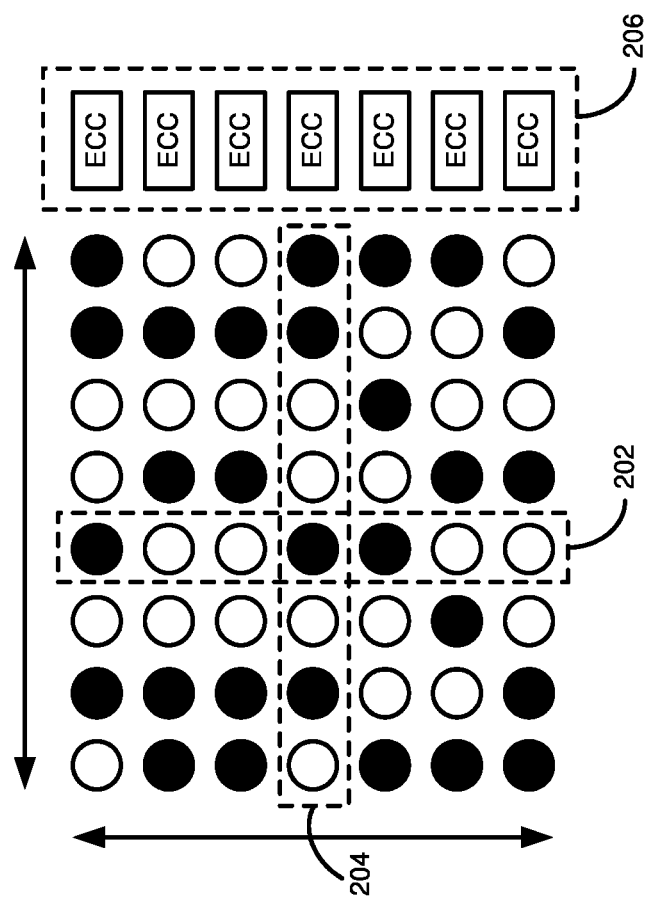
FIG. 2 is a simplified conceptual diagram of at least one embodiment of a memory matrix providing row- and column-major bit addressability in which a stochastic associative search operation may be performed.

Referring now to FIG. 2, a conceptual diagram of matrix data 200 is shown. As noted, the compute device 100 may be representative of a 3D crosspoint memory-based storage device that, instead of using word-lines and bit-lines for page data, use bit-addressable tiles. In the matrix data 200, the tiles are represented as dots, in which black dots are indicative of memory cells that are occupied (e.g., a bit stored in the memory cell is set to a bit value of 1) and in which white dots are indicative of matrix cells that are unoccupied (or otherwise as a bit value of 0). Note, although the embodiments disclosed herein describe a matrix cell having either a value of 0 or a 1, it is possible for other values to be stored therein.

Illustratively, a column selection 202 is shown in which output from a read-out of the column selection 202 corresponds to data from each row in the matrix along the column. The output is indicative of portions of data for a page read from the compute device 100. Further, a row selection 204 is shown in which output from a read-out of the row selection 204 corresponds to data from each column in the matrix along the row. The output is indicative of portions of data for a page read from the compute device 100.

As a result, the compute device 100 can retrieve a desired subset of data, e.g., in response to a query from an application, by performing, in part, column access operations. More particularly, the compute device 100 may evaluate columns against a reference set of data (also referred to herein as a "search key") to be searched. Rather than iterate through rows of the matrix to find a subset of bit data (e.g., based on a reference data set provided by the application), the compute device 100 may evaluate bit values at a column to determine whether a bit value at a given column index matches a bit value at a corresponding position in the search key. The compute device 100 may maintain a counter per row indicative of instances in which a column bit value at an index associated with the row matches with a bit value at the corresponding position in the search key. A row having a relatively high value (e.g., a value that exceeds a specified threshold) can be identified as a candidate data set that may correspond to the requested subset of data. Further, the compute device 100 may rank the candidate data sets based on the counter associated with the corresponding rows and return the results to the requesting application. Using a value such as a threshold can eliminate the need to continue searching each column, which is advantageous in situations where the search key is relatively large (e.g., tens of thousands of bits). As a result, search operations for a given subset of data may be processed relatively faster and more efficiently by the compute device 100, though the column read operation does not account for errors in the 3DXP media. Consequently, the identified candidate data set serves as a stochastic approximation, which is useful in various cases, such as in instances where an application does not need an exact match for the subset of data, or for data sets where the closest match within a specified threshold does correspond to the desired subset.

Illustratively, in some embodiments, each row written to the memory matrix may be associated with an error correction code (ECC) tag 206. More particularly, when data is written to a row, the compute device 100 may append ECC tag 206 at the end of the row or otherwise associate the ECC tag 206 with the row (e.g., storing the ECC tag 206 in a given location in memory). In an embodiment, the compute device 100 may perform, using the ECC tag 206, an error correction technique on the bits in the row having the identified candidate data set to determine whether the identified candidate data set provides an exact match with the reference data set provided in the search key. In the event that the data set is not an exact match, the error correction technique may also determine a distance from the data and reconstruct the desired subset from the identified candidate data set.

In addition, each column written to the memory matrix may be associated with an ECC tag 208. More particularly, when data is written to a column, the compute device 100 may append the ECC tag 208 at the end of the column or otherwise associate the ECC tag 208 with the column (e.g., storing the ECC tag 208 in a given location in memory). In an embodiment, the compute device 100 may perform, using the ECC tag 208, an error correction technique on the bits in the row having the identified candidate data set to determine whether the identified candidate data set provides an exact match with the reference data set provided in the search key. In the event that the data set is not an exact match, the error correction technique may also determine a distance from the data and reconstruct the desired subset from the identified candidate data set. In some cases, column-based ECC tags 208 may provide additional precision to an application.

Figure 3:
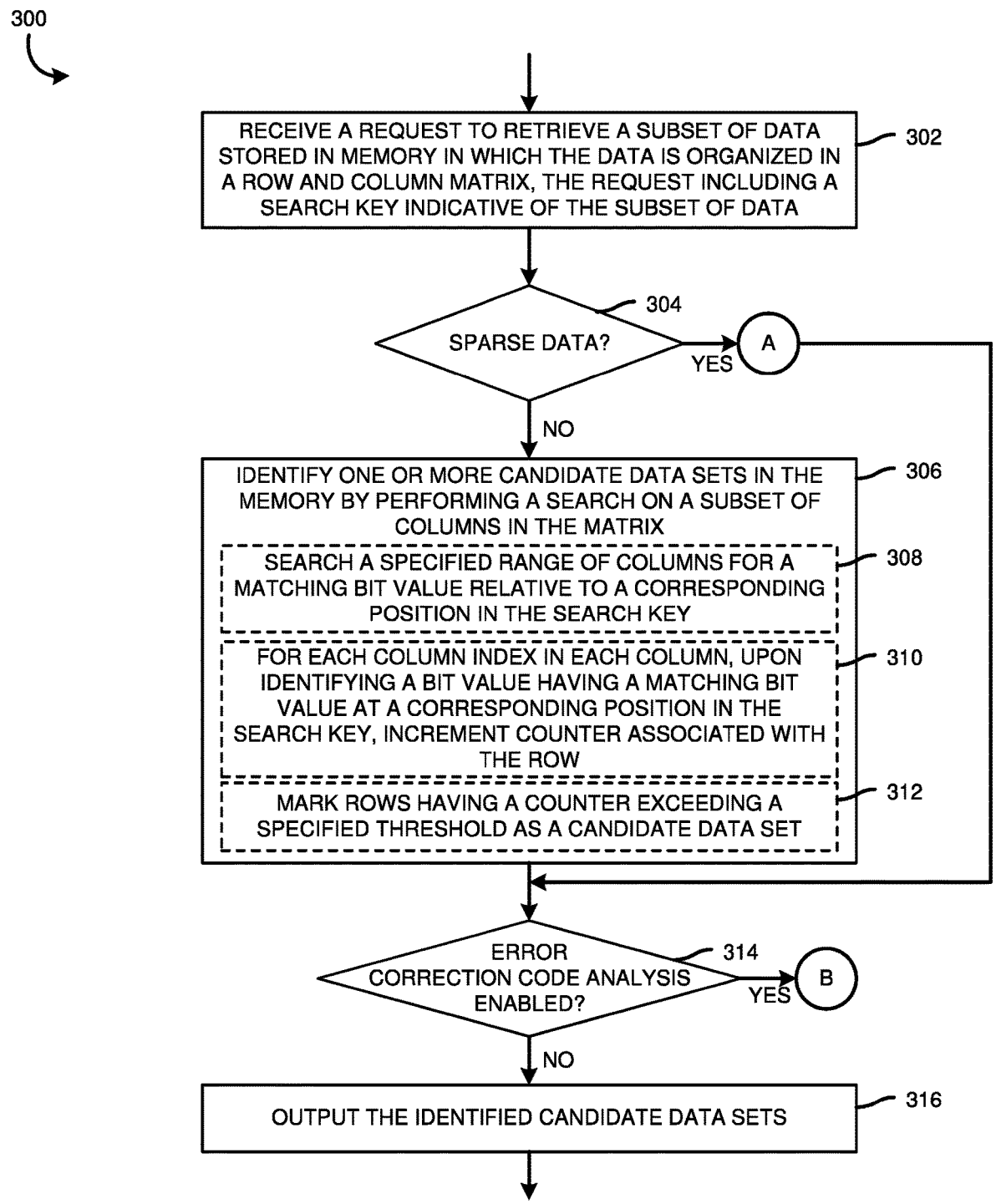
FIGS. 3 and 4 are simplified diagrams of at least one embodiment of method for performing a stochastic associative search operation on memory.
Figure 4:
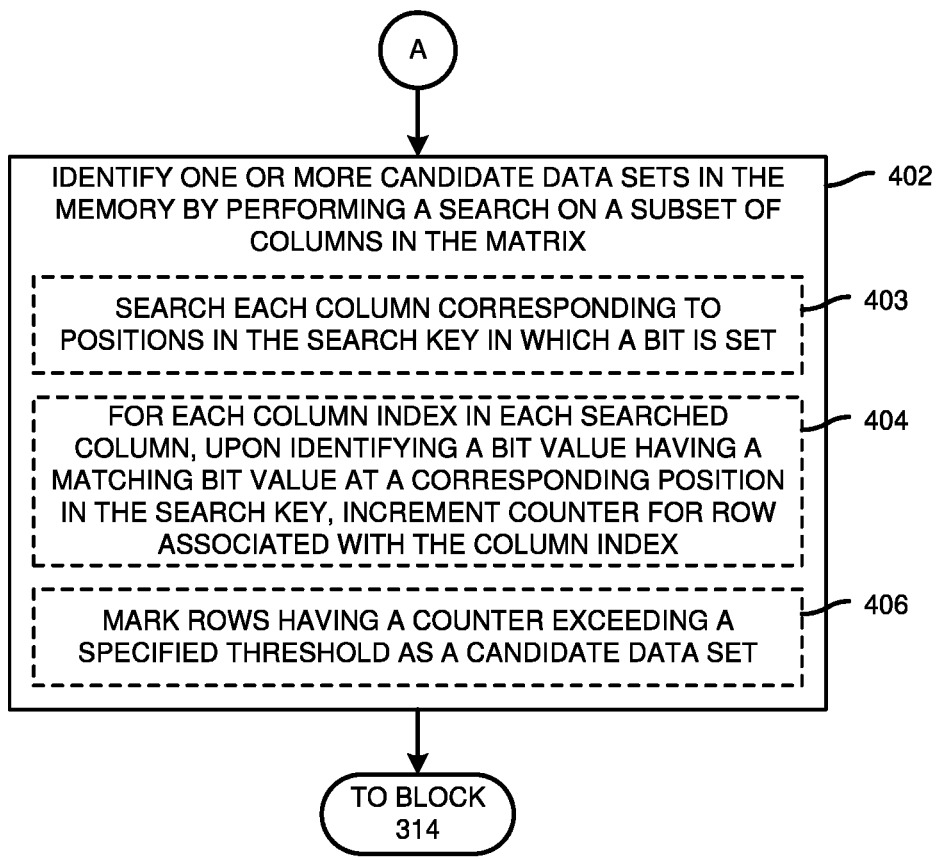

Referring now to FIGS. 3 and 4, the compute device 100, in operation, may perform a method 300 for performing a stochastic associative search operation. In this example, the method 300 is described relative to the memory 104 (e.g., via the memory controller 106 or the media access circuitry 108). However, one of skill in the art will recognize that the method can be additionally or alternatively performed using the memory of the data storage device 114 (e.g., via the memory controller 116).

As shown, the method 300 begins in block 302, in which the compute device 100 receives a request to retrieve a subset of data stored in the memory. As stated, the data may be stored in the matrix (e.g., as described relative to FIG. 2) and organized in a row and column format. Further, the request may include a search key that is indicative of the requested subset of data. The search key may be formed on the same axis as the rows in the matrix (e.g., as a one-dimensional array). The search key may also be implemented as a bit string indicative of the subset of data. In some embodiments, the search key may also specify a range of columns to search in the matrix.

In block 304, the compute device 100 determines whether the data in the matrix is sparsely distributed. For instance, the compute device 100 may do so by evaluating a configuration of the memory, e.g., whether a flag in the configuration indicates that the matrix is sparsely or densely distributed.

If the data is not sparsely distributed (e.g., the data is densely distributed or the search key specifies a given column range to search), then the method 300 proceeds to block 306, in which the compute device 100 identifies one or more candidate data sets in the memory by performing a search on a subset of columns in the matrix. For instance, in block 308, the compute device 100 can search a specified range of columns in the matrix for a matching bit value relative to a corresponding position in the search key for each index in a given column. In block 310, on such a search hit, the compute device 100 may increment a counter associated with a row associated with the column index. In block 312, the compute device 100 may mark rows having a counter value exceeding a specified threshold as a candidate data set.

Referring now to FIG. 4, if the data is sparsely distributed in the matrix, then the method 200 proceeds to block 402, in which the compute device 100 identifies one or more candidate data sets in the memory by performing a search on a subset of columns in the matrix. Of course, if the sparse encoding has more 0's than 1's, the compute device 100 may search for bits which have 0's instead of 1's. In this case, in block 404, the compute device 100 searches each column that corresponds to a position in the search key that is set (e.g., the bit value is equal to 1). That is, rather than search columns for both set and unset bits to match the search key, the compute device 100 evaluates the columns associated with set bits in the search key. In block 404, for each column index in each searched column, upon identifying a bit value having a matching bit value at a corresponding position in the search key, the compute device 100 may increment a counter associated with a row associated with the column index. In block 406, the compute device 100 may mark rows having a counter value exceeding a specified threshold as a candidate data set.

Returning to FIG. 3, the method 300 continues in block 314, in which the compute device 100 determines whether error correction code analysis is enabled for the search. If not, then in block 316, the compute device 100 outputs the identified candidate data sets. In some embodiments, the compute device 100 may rank the identified candidate data sets based on the counter values associated with the rows corresponding to the candidate data sets. The compute device 100 may then output the candidate data sets with the ranking information (e.g., the number of matching bits identified, the rank relative to other candidate data sets, etc.). In other embodiments, the compute device 100 may output the candidate data set corresponding to the row having the highest counter value.

Figure 5:
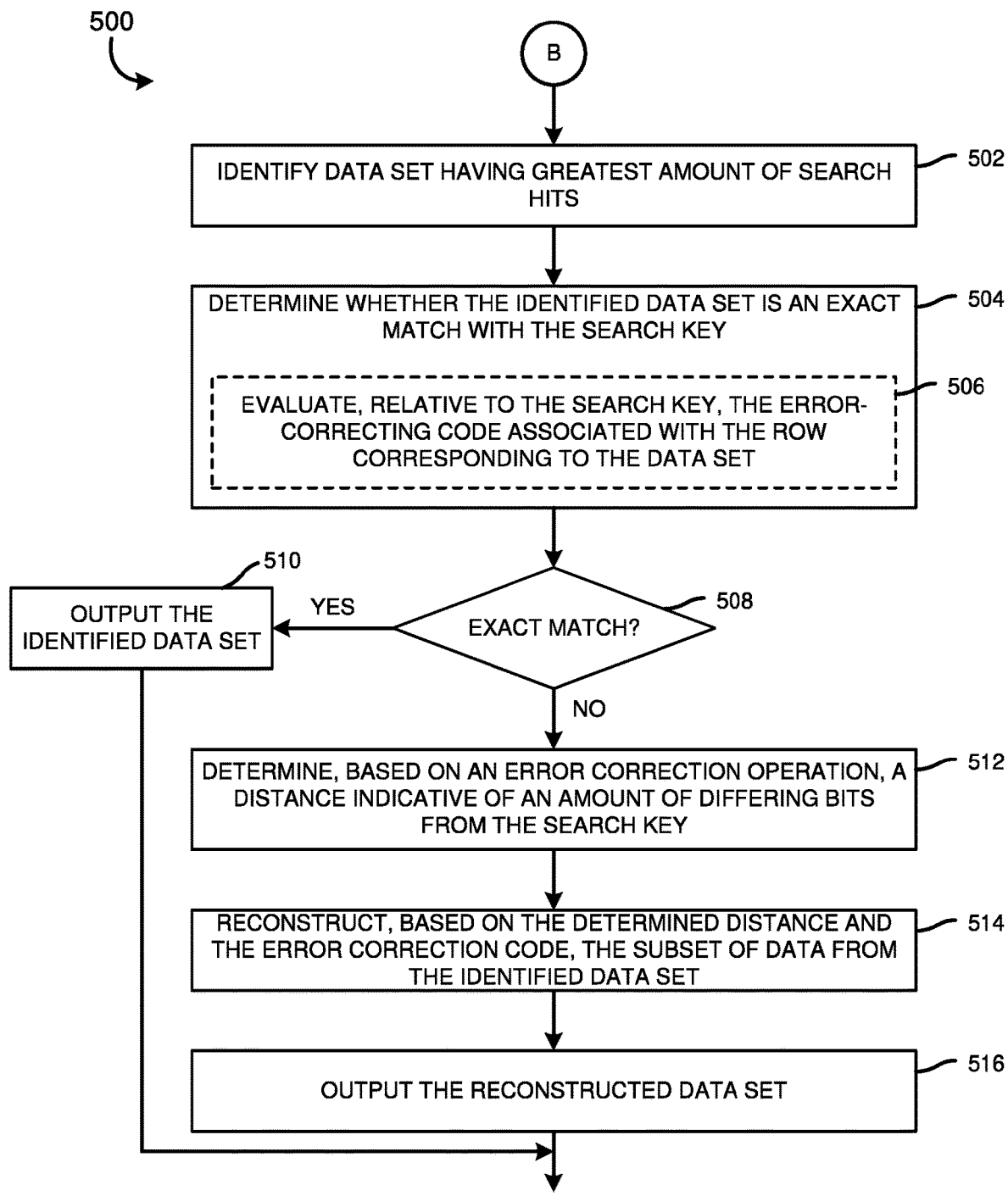
FIG. 5 is a simplified diagram of at least one embodiment of a method for performing error correction on a result of a stochastic associative search operation on memory.

In the event that error correction code analysis is enabled, then the method 200 may proceed to a method 500 for performing such error correction code analysis on the candidate data sets. The method 500 is described relative to FIG. 5. As shown, the method 500 begins in block 502, in which the compute device 100 identifies the data set having the greatest amount of search hits, e.g., the candidate data set corresponding to the row having the highest counter value.

In block 504, the compute device 100 determines whether the identified data set is an exact match with the search key. For instance, to do so, in block 506, the compute device 100 evaluates, relative to the search key, the ECC tag associated with the row corresponding to the candidate data set. The compute device 100 may compute an ECC for the search key and compare the computed ECC with the ECC tag associated with the row corresponding to the set. In addition, the compute device 100 may also evaluate an ECC tag associated with a column corresponding to the candidate data set (e.g., if the data set corresponds to a column). If the codes match (in block 508), then the identified data set is an exact match with the requested subset. In such a case, in block 510, the compute device 100 outputs the identified data set (e.g., to a requesting application).

Otherwise, if the identified data set is not an exact match with the reference data set based on an evaluation of the ECC tag, then in block 512, the compute device 100 determines, based on an error correction operation, a distance indicative of an amount of different bits from the search key. For instance, the distance may be computed using a variety of techniques, such as by a nearest neighbor algorithm, Hamming distance algorithm, and the like. In block 514, the compute device 100 reconstructs, based on the determined distance and the error correction code, the subset of data from the identified data set. In block 516, the compute device 100 outputs the reconstructed data set (e.g., to a requesting application).

Figure 6:
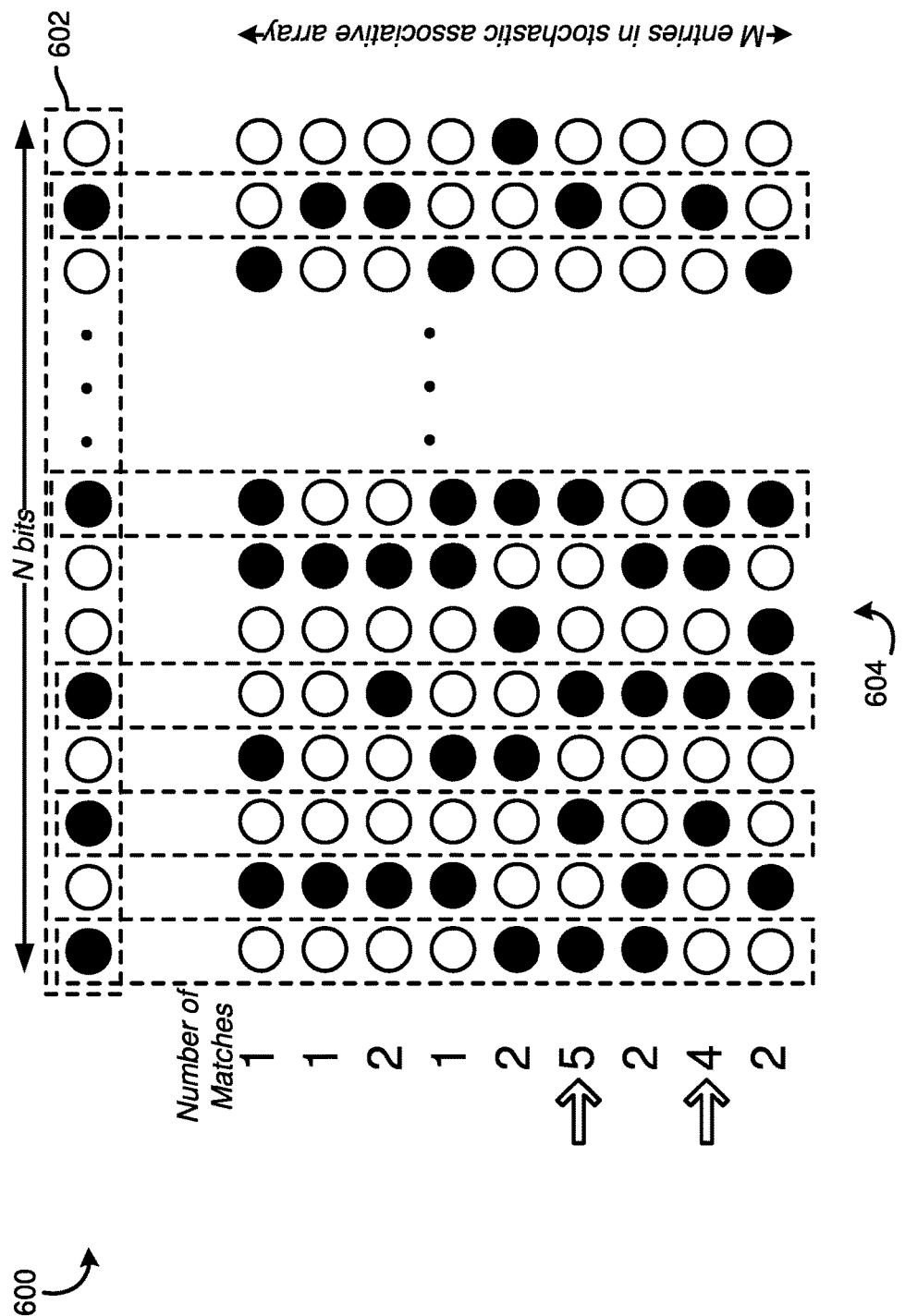
FIGS. 6 and 7 are simplified conceptual diagrams of examples of performing a stochastic associative search on memory.

Referring now to FIG. 6, a conceptual diagram of an example 600 of performing a stochastic associative search on memory is shown. In this example 600, assume that data is distributed sparsely throughout the matrix. Illustratively, a search key 602 expands to N bits, which is the same length of the rows in the matrix 604. The matrix 604 also includes M entries as part of a stochastic associative array.

The search key 602 is indicative of a reference data set having set bits in particular positions therein, represented in FIG. 6 as filled dots. In this example 600, because the matrix is representative of a sparse matrix, the compute device 100 searches only the columns of the matrix 604 that correspond to positions in the search key 602 having set bits, as indicated by the dotted rectangles running vertical down from the search key 602. Doing so reduces the amount of time spent by the compute device 100 performing a stochastic associative search operation on the data set because the compute device 100 does not evaluate every column of the matrix 604.

As stated, the compute device 100 may maintain a counter to associate with each row that is indicative of a number of matches in column indices associated with the row to the search key 602. In this case, the compute device 100 identifies, in the sparse matrix 604, two matrices as candidate data sets (indicated by the one-way arrows pointing to the rows). The two candidate data sets are associated with five matches and four matches. The compute device 100 may return, to a requesting application, each of the candidate data sets, a location associated with each data set, as well as information relating to the number of matches. An application, in turn, may process such data as needed.

Figure 7:
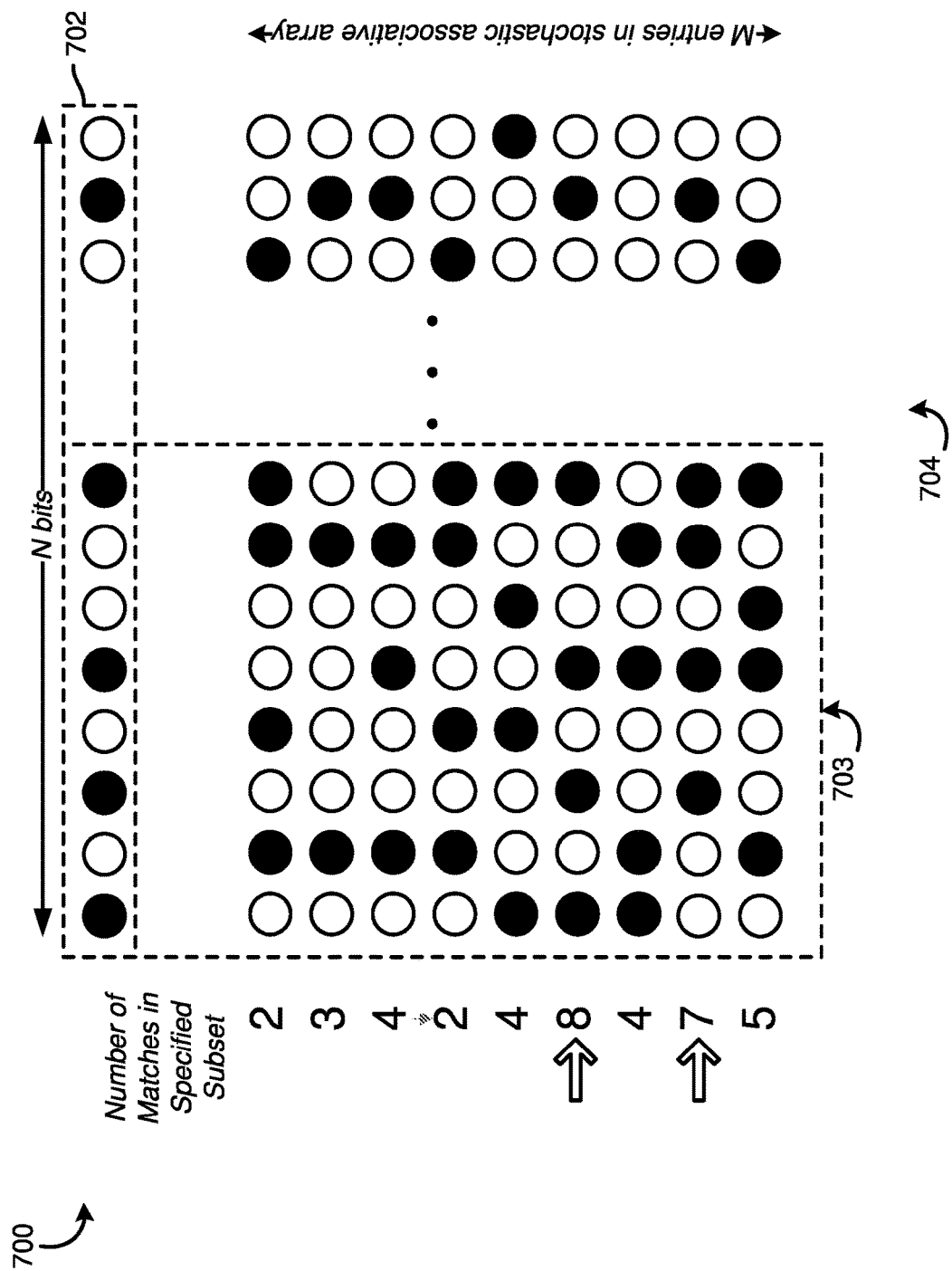

Referring now to FIG. 7, another conceptual diagram of an example 700 of performing a stochastic associative search on memory is shown. Referring now to FIG. 7, a conceptual diagram of an example 700 of performing a stochastic associative search on memory is shown. In this example 700, assume that data is distributed densely throughout a matrix 704. The example 700 may also apply to a situation in which the compute device 100 receives a request to search a specified subset 703 of columns in the matrix. Illustratively, a search key 702 expands to N bits, which is the same length of the rows in the matrix 704. The matrix 704 also includes M entries as part of a stochastic associative array.

The search key 702 is indicative of a reference data set having set bits in particular positions therein, represented in FIG. 7 as filled dots. In this example 700, the compute device 100 searches only the specified subset 703 of columns. Doing so reduces the amount of time spent by the compute device 100 performing a stochastic associative search operation on the data set because the compute device 100 does not evaluate every column of the matrix 704, in which N can correspond to a relatively large amount of columns (e.g., N can represent over 16,000 bits).

As stated, the compute device 100 may maintain a counter to associate with each row that is indicative of a number of matches in column indices associated with the row to the search key 704. In this case, the compute device 100 identifies, in the matrix 704, two matrices as candidate data sets (indicated by the one-way arrows pointing to the rows). The two candidate data sets are associated with eight matches and seven matches. The compute device 100 may return, to a requesting application, each of the candidate data sets, a location associated with each data set, as well as information relating to the number of matches. An application, in turn, may process such data as needed.

Examples

Illustrative examples of the technologies disclosed herein are provided below. An embodiment of the technologies may include any one or more, and any combination of, the examples described below.

Example 1 includes an apparatus comprising a cross-point architecture memory comprising a matrix storing individually addressable bit data, the matrix formed by a plurality of rows and a plurality of columns, wherein each row in the matrix is associated with an error correction code; and a circuitry to receive a request to retrieve a subset of the bit data stored in the matrix; identify, based on a search performed on the plurality of columns in the matrix, one or more candidate data sets, wherein each candidate data set corresponds to one of the plurality of rows in the matrix; and perform an error correction operation on the identified one or more candidate data sets to determine whether the identified one or more candidate data sets is an exact match with the subset of the bit data.

Example 2 includes the subject matter of Example 1, and wherein to perform the error correction operation comprises to evaluate, relative to the subset of the bit data to be retrieved, the error correction code associated with the row corresponding to the candidate data set.

Example 3 includes the subject matter of any of Examples 1 and 2, and wherein the circuitry is further to, upon a determination that the identified one or more candidate data sets is not an exact match with the subset of the bit data, determine, a distance indicative of an amount of bits that differ between the subset of the bit data to be retrieved and the identified one or more candidate data sets.

Example 4 includes the subject matter of any of Examples 1-3, and wherein the circuitry is further to reconstruct the subset of data from the identified one or more candidate data sets based on the determined distance.

Example 5 includes the subject matter of any of Examples 1-4, and wherein the circuitry is further to output reconstructed subset of data.

Example 6 includes the subject matter of any of Examples 1-5, and wherein the circuitry is further to, upon a determination that the identified one or more candidate data sets is an exact match with the subset of the bit data, output the identified one or more candidate data sets.

Example 7 includes the subject matter of any of Examples 1-6, and wherein to receive the request comprises to receive a request to retrieve a subset of the bit data stored in the matrix in the memory, wherein the memory is of a three-dimensional cross-point architecture.

Example 8 includes the subject matter of any of Examples 1-7, and wherein the circuitry is further to identify, based on a search performed on the plurality of rows in the matrix, one or more candidate data sets corresponding to one of the plurality of columns in the matrix.

Example 9 includes a compute device comprising a data storage device comprising a cross-point architecture memory comprising a matrix storing individually addressable bit data, the matrix formed by a plurality of rows and a plurality of columns, wherein each row in the matrix is associated with an error correction code; and a memory controller to receive a request to retrieve a subset of the bit data stored in the matrix; identify, based on a search performed on the plurality of columns in the matrix, one or more candidate data sets, wherein each candidate data set corresponds to one of the plurality of rows in the matrix; and perform an error correction operation on the identified one or more candidate data sets to determine whether the identified one or more candidate data sets is an exact match with the subset of the bit data.

Example 10 includes the subject matter of Example 9, and wherein to perform the error correction operation comprises to evaluate, relative to the subset of the bit data to be retrieved, the error correction code associated with the row corresponding to the candidate data set.

Example 11 includes the subject matter of any of Examples 9 and 10, and wherein the memory controller is further to, upon a determination that the identified one or more candidate data sets is not an exact match with the subset of the bit data, determine, a distance indicative of an amount of bits that differ between the subset of the bit data to be retrieved and the identified one or more candidate data sets.

Example 12 includes the subject matter of any of Examples 9-11, and wherein the memory controller is further to reconstruct the subset of data from the identified one or more candidate data sets based on the determined distance.

Example 13 includes the subject matter of any of Examples 9-12, and wherein the memory controller is further to output reconstructed subset of data.

Example 14 includes the subject matter of any of Examples 9-13, and wherein the memory controller is further to, upon a determination that the identified one or more candidate data sets is an exact match with the subset of the bit data, output the identified one or more candidate data sets.

Example 15 includes the subject matter of any of Examples 9-14, and wherein to receive the request comprises to receive a request to retrieve a subset of the bit data stored in the matrix in the memory, wherein the memory is of a three-dimensional cross-point architecture.

Example 16 includes a compute device comprising a cross-point architecture memory comprising a matrix storing individually addressable bit data, the matrix formed by a plurality of rows and a plurality of columns, wherein each row in the matrix is associated with an error correction code; and circuitry for receiving a request to retrieve a subset of the bit data stored in the matrix; means for identifying, based on a search performed on the plurality of columns in the matrix, one or more candidate data sets, wherein each candidate data set corresponds to one of the plurality of rows in the matrix; and means for performing an error correction operation on the identified one or more candidate data sets to determine whether the identified one or more candidate data sets is an exact match with the subset of the bit data.

Example 17 includes the subject matter of Example 16, and wherein the means for performing the error correction operation comprises circuitry for evaluating, relative to the subset of the bit data to be retrieved, the error correction code associated with the row corresponding to the candidate data set.

Example 18 includes the subject matter of any of Examples 16 and 17, and further including means for determining, upon determining that the identified one or more candidate data sets is not an exact match with the subset of the bit data, a distance indicative of an amount of bits that differ between the subset of the bit data to be retrieved and the identified one or more candidate data sets.

Example 19 includes the subject matter of any of Examples 16-18, and further including means for reconstructing the subset of data from the identified one or more candidate data sets based on the determined distance; and circuitry for outputting reconstructed subset of data.

Example 20 includes the subject matter of any of Examples 16-19, and wherein the circuitry for receiving the request comprises circuitry for receiving a request to retrieve a subset of the bit data stored in the matrix in the memory, wherein the memory is of a three-dimensional cross-point architecture.

The invention claimed is:

1. An apparatus comprising:
a cross-point architecture memory comprising a matrix storing individually addressable bit data, wherein the individually addressable bit data is readable and writable on a bit-by-bit basis, the matrix formed by a plurality of rows and a plurality of columns, wherein each row in the matrix is associated with an error correction code; and
a circuitry to:
receive a request to retrieve a subset of the bit data stored in the matrix, wherein the request includes a search key;
identify, based on a search performed on the plurality of columns in the matrix, one or more candidate data sets, wherein each candidate data set corresponds to one of the plurality of rows in the matrix, and wherein the identification is based on the search key; and
perform an error correction operation on the identified one or more candidate data sets to determine whether the identified one or more candidate data sets is an exact match between an error correction code of the search key and the error correction code associated with the subset of the bit data.

2. The apparatus of claim 1, wherein to perform the error correction operation comprises to evaluate, relative to the subset of the bit data to be retrieved, the error correction code associated with the row corresponding to the candidate data set.

3. The apparatus of claim 1, wherein the circuitry is further to, upon a determination that the identified one or more candidate data sets is not an exact match with the subset of the bit data, determine, a distance indicative of an amount of bits that differ between the subset of the bit data to be retrieved and the identified one or more candidate data sets.

4. The apparatus of claim 3, wherein the circuitry is further to reconstruct the subset of data from the identified one or more candidate data sets based on the determined distance.

5. The apparatus of claim 4, wherein the circuitry is further to output reconstructed subset of data.

6. The apparatus of claim 1, wherein the circuitry is further to, upon a determination that the identified one or more candidate data sets is an exact match with the subset of the bit data, output the identified one or more candidate data sets.

7. The apparatus of claim 1, wherein to receive the request comprises to receive a request to retrieve a subset of the bit data stored in the matrix in the memory, wherein the memory is of a three-dimensional cross-point architecture.

8. The apparatus of claim 1, wherein to perform the error correction operation comprises to evaluate the error correction code associated with a corresponding column being read.

9. A compute device comprising:
a data storage device comprising:
a cross-point architecture memory comprising a matrix storing individually addressable bit data, wherein the individually addressable bit data is readable and writable on a bit-by-bit basis, the matrix formed by a plurality of rows and a plurality of columns, wherein each row in the matrix is associated with an error correction code; and
a memory controller to:
receive a request to retrieve a subset of the bit data stored in the matrix, wherein the request includes a search key;
identify, based on a search performed on the plurality of columns in the matrix, one or more candidate data sets, wherein each candidate data set corresponds to one of the plurality of rows in the matrix, and wherein the identification is based on the search key; and
perform an error correction operation on the identified one or more candidate data sets to determine whether the identified one or more candidate data sets is an exact match between an error correction code of the search key and the error correction code associated with the subset of the bit data.

10. The compute device of claim 9, wherein to perform the error correction operation comprises to evaluate, relative to the subset of the bit data to be retrieved, the error correction code associated with the row corresponding to the candidate data set.

11. The compute device of claim 9, wherein the memory controller is further to, upon a determination that the identified one or more candidate data sets is not an exact match with the subset of the bit data, determine, a distance indicative of an amount of bits that differ between the subset of the bit data to be retrieved and the identified one or more candidate data sets.

12. The compute device of claim 11, wherein the memory controller is further to reconstruct the subset of data from the identified one or more candidate data sets based on the determined distance.

13. The compute device of claim 12, wherein the memory controller is further to output reconstructed subset of data.

14. The compute device of claim 9, wherein the memory controller is further to, upon a determination that the identified one or more candidate data sets is an exact match with the subset of the bit data, output the identified one or more candidate data sets.

15. The compute device of claim 9, wherein to receive the request comprises to receive a request to retrieve a subset of the bit data stored in the matrix in the memory, wherein the memory is of a three-dimensional cross-point architecture.

16. A compute device comprising:
a cross-point architecture memory comprising a matrix storing individually addressable bit data, wherein the individually addressable bit data is readable and writable on a bit-by-bit basis, the matrix formed by a plurality of rows and a plurality of columns, wherein each row in the matrix is associated with an error correction code; and circuitry for receiving a request to retrieve a subset of the bit data stored in the matrix wherein the request includes a search key;

means for identifying, based on a search performed on the plurality of columns in the matrix, one or more candidate data sets, wherein each candidate data set corresponds to one of the plurality of rows in the matrix, and wherein the identification is based on the search key; and means for performing an error correction operation on the identified one or more candidate data sets to determine whether the identified one or more candidate data sets is an exact match between an error correction code of the search key and the error correction code associated with the subset of the bit data.

17. The compute device of claim 16, wherein the means for performing the error correction operation comprises circuitry for evaluating, relative to the subset of the bit data to be retrieved, the error correction code associated with the row corresponding to the candidate data set.

18. The compute device of claim 16, further comprising means for determining, upon determining that the identified one or more candidate data sets is not an exact match with the subset of the bit data, a distance indicative of an amount of bits that differ between the subset of the bit data to be retrieved and the identified one or more candidate data sets.

19. The compute device of claim 18, further comprising:
means for reconstructing the subset of data from the identified one or more candidate data sets based on the determined distance; and
circuitry for outputting reconstructed subset of data.

20. The compute device of claim 16, wherein the circuitry for receiving the request comprises circuitry for receiving a request to retrieve a subset of the bit data stored in the matrix in the memory, wherein the memory is of a three-dimensional cross-point architecture.

* * * * *